(12) United States Patent
Sohda et al.

(10) Patent No.: US 9,312,091 B2
(45) Date of Patent: Apr. 12, 2016

(54) CHARGED PARTICLE BEAM APPARATUS

(71) Applicant: Hitachi High-Technologies Corporation, Minato-ku, Tokyo (JP)

(72) Inventors: Yasunari Sohda, Tokyo (JP); Tasuku Yano, Tokyo (JP); Muneyuki Fukuda, Tokyo (JP); Noritsugu Takahashi, Tokyo (JP); Hajime Kawano, Tokyo (JP); Hiroyuki Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/396,769

(22) PCT Filed: Apr. 18, 2013

(86) PCT No.: PCT/JP2013/061554
§ 371 (c)(1),
(2) Date: Oct. 24, 2014

(87) PCT Pub. No.: WO2013/161684
PCT Pub. Date: Oct. 31, 2013

(65) Prior Publication Data
US 2015/0076362 A1   Mar. 19, 2015

(30) Foreign Application Priority Data

Apr. 24, 2012   (JP) .................................. 2012-098311

(51) Int. Cl.
| G21K 5/04 | (2006.01) |
| H01J 37/141 | (2006.01) |
| H01J 37/153 | (2006.01) |
| H01J 37/28 | (2006.01) |
| H01J 37/147 | (2006.01) |

(52) U.S. Cl.
CPC ............. *H01J 37/141* (2013.01); *H01J 37/147* (2013.01); *H01J 37/153* (2013.01); *H01J 37/28* (2013.01); *H01J 2237/1405* (2013.01); *H01J 2237/1532* (2013.01); *H01J 2237/1536* (2013.01)

(58) Field of Classification Search
USPC ...... 250/396 R, 397, 398, 396 ML, 305, 306, 250/307, 309, 310, 311, 492.1, 492.21, 250/492.22, 492.23, 492.3
See application file for complete search history.

(56) References Cited

U.S. PATENT DOCUMENTS

| 3,930,181 | A | 12/1975 | Pfeiffer |
| 6,452,175 | B1 | 9/2002 | Adamec |
| 2001/0010357 | A1 | 8/2001 | Ose et al. |
| 2002/0126366 | A1 | 9/2002 | Weickenmeier |
| 2003/0089859 | A1 | 5/2003 | Adamec |

(Continued)

FOREIGN PATENT DOCUMENTS

| JP | 50-099464 A | 8/1975 |
| JP | 54-137977 A | 10/1979 |

(Continued)

*Primary Examiner* — Nicole Ippolito
(74) *Attorney, Agent, or Firm* — Miles & Stockbridge P.C.

(57) ABSTRACT

In order to provide a charged particle beam apparatus enabling reduction of deflecting coma aberration in cases such as where wide field-of-view scanning is carried out, a charged particle beam apparatus is provided with an electromagnetic objective lens and a stage on which a sample is placed, wherein the electromagnetic objective lens is provided with the following: a plurality of magnetic paths; an objective lens coil; an opening disposed so as to face the sample; an inner lens deflector disposed more on the objective lens coil side than the end of the opening.

11 Claims, 9 Drawing Sheets

(56) References Cited

U.S. PATENT DOCUMENTS

| | | |
|---|---|---|
| 2003/0183773 A1* | 10/2003 | Haraguchi ............ 250/396 ML |
| 2003/0209674 A1* | 11/2003 | Hamaguchi et al. ... 250/396 ML |
| 2004/0046125 A1* | 3/2004 | Chen .................... H01J 37/141 |
| | | 250/396 ML |
| 2004/0084629 A1 | 5/2004 | Preikszas et al. |
| 2009/0114818 A1* | 5/2009 | Casares et al. ............... 250/307 |
| 2011/0139996 A1* | 6/2011 | Chen et al. ............ 250/396 ML |
| 2012/0286158 A1 | 11/2012 | Sohda et al. |

FOREIGN PATENT DOCUMENTS

| | | |
|---|---|---|
| JP | 11-224845 A | 8/1999 |
| JP | 2000-348658 A | 12/2000 |
| JP | 2002-343714 A | 11/2002 |
| JP | 2003-521096 A | 7/2003 |
| JP | 2004-134379 A | 4/2004 |
| JP | 2005-063983 A | 3/2005 |
| WO | WO 2011/108368 A1 | 9/2011 |

\* cited by examiner

| CORRECTION ITEM | ON/OFF |
|---|---|
| FOCAL POINT | ON |
| ASTIGMATISM | ON |
| DEFLECTION CHROMATIC | ON |
| COMA | ON |

CHARGED PARTICLE BEAM APPARATUS

TECHNICAL FIELD

The present invention relates to a charged particle beam apparatus that performs an inspection, a measurement, and the like using a charged particle beam such as an electron beam.

BACKGROUND ART

A scanning electron microscope (SEM) used to observe, inspect, or measure a sample using an electron beam, which is one of charged particle beams, accelerates electrons emitted from an electron source and converges onto a surface of the sample using an electrostatic lens or an electromagnetic lens for irradiation thereon. They are referred to as primary electrons. Incidence of the primary electrons generates secondary electrons (sometimes low-energy electrons may be referred to as the secondary electrons and high-energy electrons as reflection electrons, distinctively). By detecting the secondary electrons while deflecting and scanning the electron beam, it is possible to obtain a scanning image of a fine pattern and a composition distribution on the sample. It is also possible to form an absorption current image by detecting electrons absorbed by the sample.

Conventional methods of deflecting an electron beam are disclosed in, for example, Patent Documents 1 and 2. These Patent Documents aim to reduce a deflection aberration caused by the deflection of the electron beam by overlapping a field of an electromagnetic deflector and a field of an electromagnetic lens.

PRIOR ART DOCUMENT

Patent Document

Patent document 1: Japanese Patent Laid-open No. 2004-134379
Patent document 2: Japanese Patent Laid-open No. 2003-521096

SUMMARY OF INVENTION

Technical Problem

One of the features considered to be desirable for a scanning electron microscope may be an ability to scan a wide visual field without substantially degrading the resolution of the electron beam. As miniaturization of semiconductor devices progresses, two-dimensional high-speed inspection of a resist pattern is required more and scanning a wider visual field is required for enlargement of an inspection area and reduction of shrinkage.

The inventors now reviewed problems in a case where the wide visual field is scanned using the conventional deflection method. According to Patent Document 1, although the magnetic fields of the electromagnetic lens and the electromagnetic deflector are overlapping, the electromagnetic deflector is larger than an aperture of the electromagnetic lens and it is located on the side of the electron beam (opposite side form a lens coil). Thus, it is found that there is a large distribution of a deflection field in vertical directions on an axis that the electron beam passes resulting in a smaller proportion of the overlapping field, and that, in Patent Document 2, the electromagnetic deflector is surrounded by a magnetic structure around the electromagnetic lens and overlaps the field of the electromagnetic lens but it does not align with the aperture position of the electromagnetic lens to limit the proportion of the overlap.

Thus, it is concerned that scanning the wide visual field using these conventional techniques may not attain an effect of sufficiently reducing the deflection coma aberration. Moreover, it is also found that a larger electrostatic lens field is required to improve the on-axis resolution, and the turbulence of the electrostatic lens field due to the location of the electromagnetic deflector overlapping the electrostatic lens field may lead to degradation of the lens performance.

An object of the present invention is to provide a charged particle beam apparatus capable of reducing the deflection coma aberration even when scanning a wide visual field.

Solution to Problem

One implementation to achieve the above object is a charged particle beam apparatus including a charged particle source, an upper stage deflector deflecting a charged particle beam emitted from the charged particle source, an electromagnetic objective lens irradiating the charged particle beam deflected by the upper stage deflector onto a sample, and a stage on which the sample is placed, wherein the electromagnetic objective lens has a plurality of magnetic paths and an objective lens coil surrounded by the plurality of magnetic paths, an aperture constituted by the plurality of magnetic paths and positioned to face the sample, and an in-lens deflector arranged closer to the objective lens coil than an end of the aperture.

There is also provided a charged particle beam apparatus including a charged particle source, an upper stage deflector, an electromagnetic objective lens, and a stage on which a sample is placed, all sequentially arranged along a travelling direction of a charged particle beam emitted from the charged particle source, wherein the electromagnetic objective lens has an upper magnetic path and a lower magnetic path, an objective lens coil surrounded by the upper magnetic path and the lower magnetic path, an aperture constituted by the upper magnetic path and the lower magnetic path and arranged to face the sample, and an in-lens deflector including a toroidal coil and arranged closer to the objective lens coil than an end of the aperture.

Advantageous Effects of the Invention

The present invention can provide a charged particle beam apparatus capable of reducing the deflection coma aberration even when scanning a wide visual field.

DESCRIPTION OF EMBODIMENTS

As a result of reviewing technologies for achieving the above object, the inventors found that the deflection coma aberration can be reduced by providing a deflector (in-lens deflector) inside an objective lens having a space surrounded by an upper magnetic path and a lower magnetic path, though in which configuration the effectiveness was initially considered doubtful. It is particularly effective to provide the in-lens deflector closer to the objective lens coil than an aperture end facing a sample for the objective lens (in a magnetic path of the objective electromagnetic lens). It should be noted that the term "facing" means that the aperture end has only to be directed to the sample and may have a certain angle between a plane of the aperture end and a surface of the sample. It is desirable, however, that these planes are parallel to each other. Furthermore, it is also effective to provide another deflector on an upper state of the objective lens and coordinate a plurality of deflectors. This enables reduction of the deflection coma aberration effectively and with the least adverse effect (such as degradation of the lens performance).

Detailed description is given below using embodiments.

First Embodiment

Figure 1:
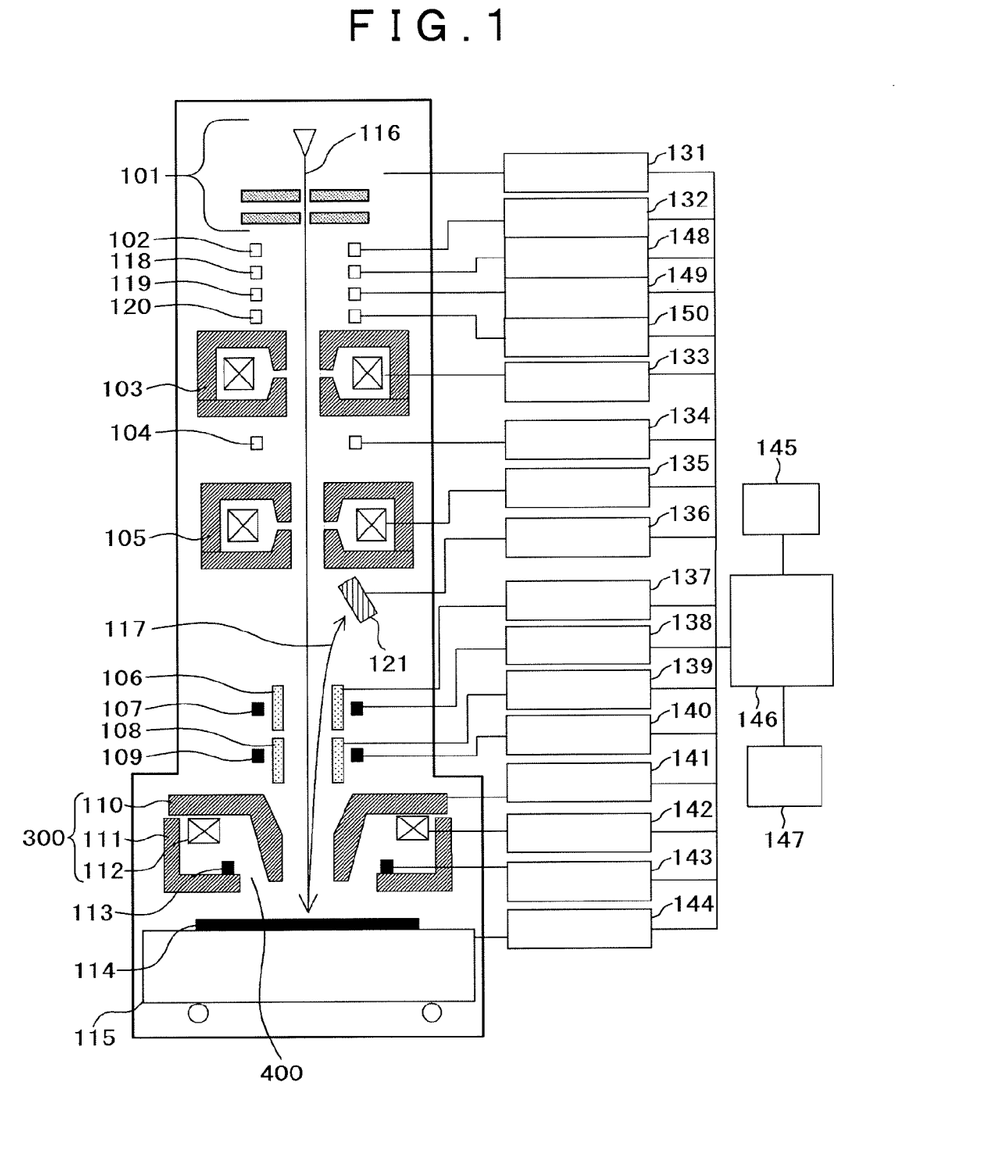
FIG. 1 is an overall schematic configuration diagram showing a charged particle beam apparatus (scanning electron microscope) according to a first embodiment of the present invention.

A first embodiment of the present invention is described below with reference to FIGS. 1 to 5 and 10. FIG. 1 shows an overall schematic configuration diagram of a scanning electron microscope according to a first embodiment. Primary electrons 116 emitted from an electron gun 101 are focused on the sample by a first condenser lens 103, a second condenser lens 105, and an objective lens constituted by an objective lens upper magnetic path 110, an objective lens lower magnetic path 111, and an objective lens coil 112. An objective lens upper magnetic path is applied with positive voltage and a sample 114 is applied with negative voltage, which forms an electrostatic lens, and thus the objective lens is an electromagnetic field superimposed lens. An aperture 400 of the lens is directed to the sample, which forms a lens structure called semi-in-lens type. However, the aperture of the objective lens has only to be directed to the sample but it is not limited to the semi-in-lens type. Secondary electrons 117 emitted from the sample 114 (although there is a case where low-speed electrons are referred to as secondary electrons and high-speed electrons as reflection electrons, they are collectively expressed as the secondary electrons herein) are detected by a detector 121 located in the middle. The primary electrons on the sample are two-dimensionally scanned by a first scanning deflector 106 and a second scanning deflector 108, resulting in a two-dimensional image. The center of the two-dimensional image is defined by a first deflector 107 and a second deflector 109. In this embodiment, the first and second scanning deflectors are electrostatic deflectors, and the first and second deflectors are electromagnetic deflectors. The two-dimensional image is displayed on a display device 147.

Denoted by 115 is a stage, 131 is an electron gun control unit, 133 is a first condenser lens control unit, 135 is a second condenser lens control unit, 137 is a first scanning deflector control unit, 139 is a second scanning deflection control unit, 138 is a first deflector control unit, 140 is a second deflector control unit, 141 is a booster voltage control unit, 142 is an objective lens control unit, 144 is a sample voltage control unit, 136 is a detection system control unit, 102 is a first aligner, 132 is a first aligner control unit, 104 is a second aligner, 134 is a second aligner control unit, 118 is a focal point corrector, 148 is a focal point corrector control unit, 119 is an astigmatism corrector, 149 is an astigmatism corrector control unit, 120 is a deflection chromatic aberration corrector, 150 is a deflection chromatic aberration corrector control unit, 145 is a recording device, and 146 is a control operation device for the whole apparatus. It should be noted that the same reference numerals generally refer to the same components.

Figure 2:
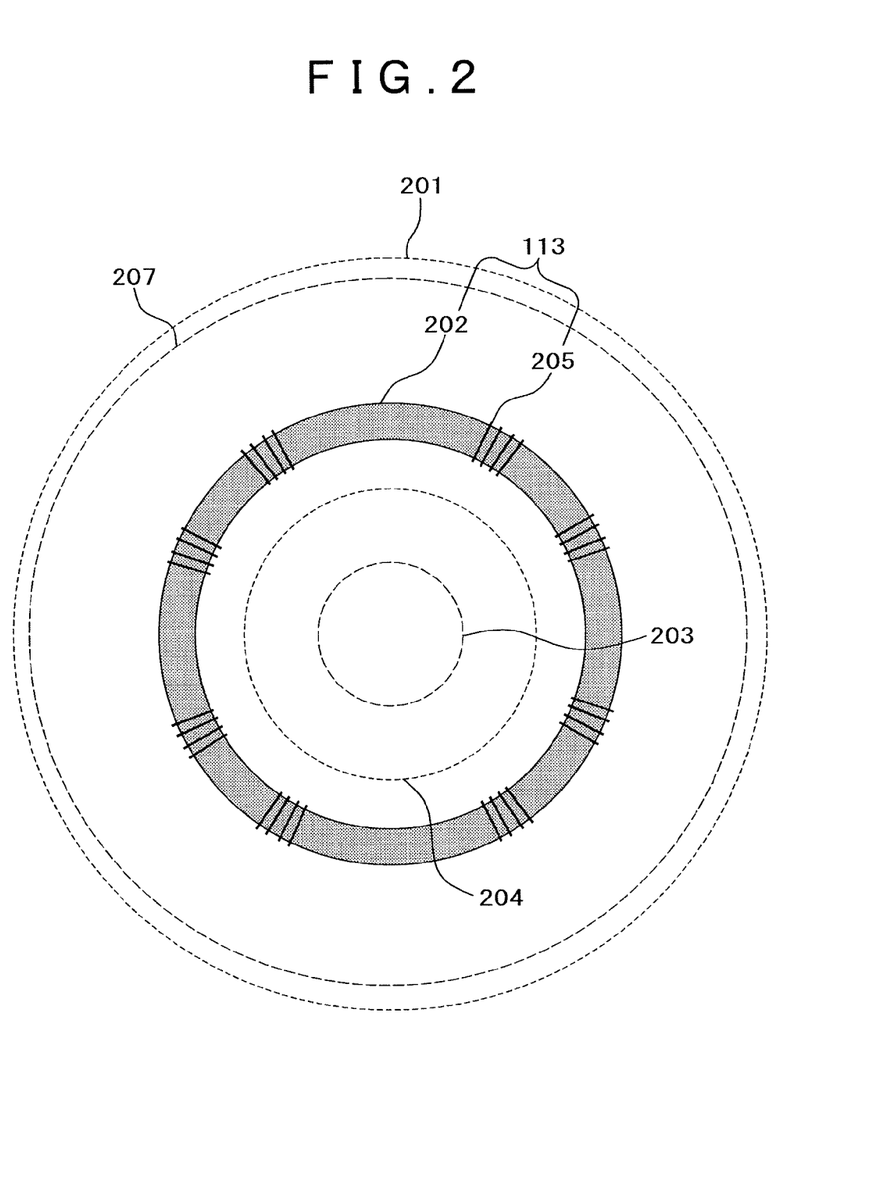
FIG. 2 is a top view of a third deflector in the scanning electron microscope according to the first embodiment.

Moreover, a third deflector (in-lens deflector) 113 is arranged in the magnetic path of the objective lens (closer to the objective lens coil than the aperture of the magnetic path). Denoted by 143 is a third deflector control unit. Shown in FIG. 2 is a top view around the third deflector. The third deflector 113 is a toroidal deflector including a toroidal coil 205 wound around a ring-shaped ferrite core 202. Denoted by 201 is an outer periphery of the objective lens lower magnetic path, 204 is an inner periphery of the objective lens lower magnetic path, 207 is an outer periphery of the objective lens upper magnetic path, and 203 is an inner periphery of the objective lens upper magnetic path. In this embodiment, the deflection coma aberration is reduced by adding the third deflector to the first and second deflectors 107, 109 and cooperatively controlling them. It should be noted that the number of the deflectors outside the objective lens is not limited to two. Because an effect of the third deflector on the convergence action of electrons on the axis can be ignored by arranging the third deflector (in-lens deflector) in the magnetic path of the objective lens, the on-axis resolution is not degraded by the third deflector. Moreover, by arranging the deflector in the magnetic path of the objective lens, distribution of the deflecting lens magnetic field concentrates on the magnetic path aperture 400 allowing for increasing an overlap of positions of the lens magnetic field and the deflecting magnetic field, and consequently it can be expected to increase an in-lens effect of the deflector. Furthermore, in this structure, the electrostatic lens can be used because the electrostatic lens field formed by a potential difference between the objective lens upper magnetic path 110 and the sample 114 is not disturbed. In this structure, the on-axis resolutions with and without the electrostatic lens are 1.8 nm and 5.2 nm, respectively.

Using a dense-core toroidal deflector is effective for the following two reasons. Firstly, using ferrite that is a magnetic body can increase deflection sensitivity, thereby compensating the reduction of the deflection sensitivity due to the shielding effect of the lens magnetic path. Moreover, because the magnetic body is flat without any irregular structure in its rotating direction to have a rotationally symmetrical shape, it will not give any asymmetrical effect on the lens magnetic field. Note that the term "flat" includes a structure having no irregularity formed intentionally. For these reasons, efficient deflection sensitivity can be obtained without adversely affecting the lens performance on the axis, and consequently the correction of the deflection coma aberration is possible. To arrange the third deflector in the magnetic path of the objective lens as shown in FIG. 2, a diameter of the third deflector is made larger than the diameters of the inner peripheries 203, 204 of the upper magnetic path and the lower magnetic path forming the lens magnetic field and smaller than the diameters of the outer peripheries 207, 201 of the upper magnetic path and the lower magnetic path. This enables an arrangement of the electromagnetic deflector closer to the objective lens coil than the aperture 400 of the lens magnetic path.

Figure 3:
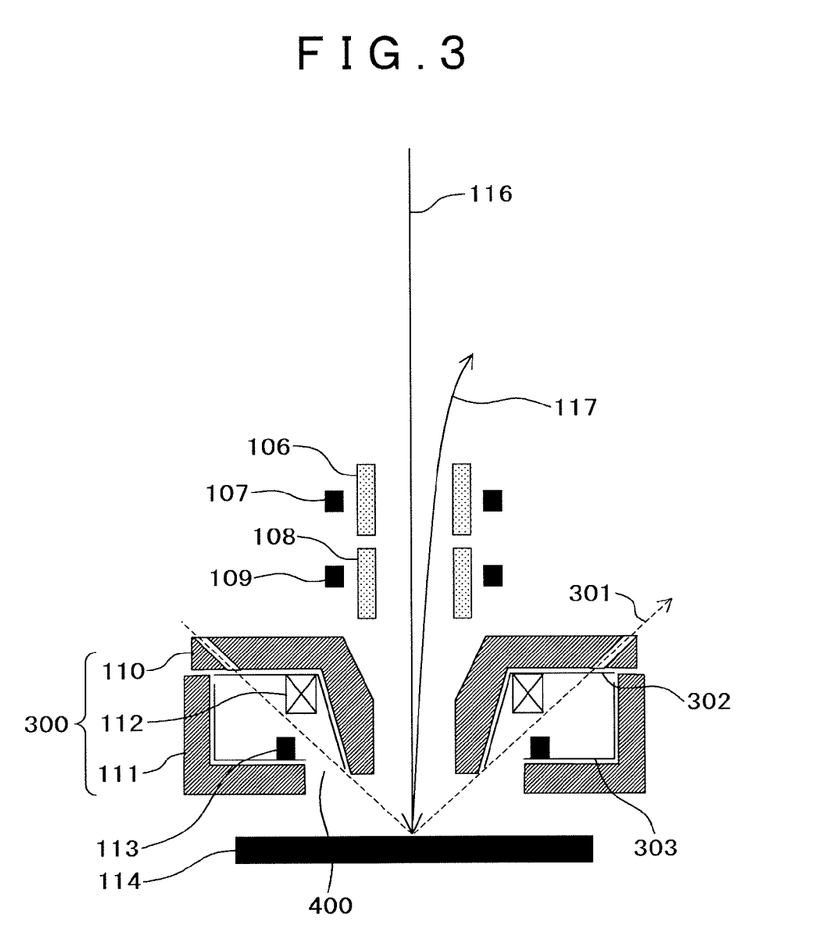
FIG. 3 is an enlarged cross sectional view of a main part illustrating an objective optical system in the scanning electron microscope according to the first embodiment.

FIG. 3 shows a part of the objective lens 300 in detail, particularly illustrating upper magnetic path and lower magnetic path ferrite shields 302, 303 and a height-detection optical path 301. One problem for arranging the electromagnetic deflector 113 in the space surrounded by the objective lens upper magnetic path 110 and the objective lens lower magnetic path 111 (in the objective lens magnetic path) is response speed of the deflector 113. When the magnetic field of the electromagnetic deflector 113 interacts directly with the lens magnetic paths 110, 111, the response speed is delayed by eddy current. The eddy current easily occurs in the lens magnetic paths 110, 111 because of using permalloy or pure iron having a high magnetic permeability. Therefore, in this embodiment, shields 302, 303 made of ferrite are provided between the lens magnetic paths 110, 111 and the deflector 113 in the magnetic path. High-speed response can be expected because ferrite has no electrical conduction and causes no eddy current. The ferrite shields 302, 303 are arranged so as not to affect the lens magnetic field and not to be external to the lens magnetic paths 110, 111. Moreover, to avoid magnetic coupling with permalloy, the ferrite shields 302, 303 are spaced from permalloy. Although the ferrite shield is preferably arranged facing an entire face of the inner wall of the magnetic path, the effect of reducing the eddy current can be achieved even when it is provided only partially.

Another problem for arranging the electromagnetic deflector 113 in the objective lens magnetic path can be the height-detection optical path 301. When the objective lens 300 is close to the sample 114, the height-detection optical path 301 often passes through the aperture 400 of the objective lens 300. Therefore, the optical path is provided between the objective lens coil 112 and the electromagnetic deflector 113 so that the in-lens deflector 113 in this embodiment may not interrupt the optical path. Thus, the in-lens deflector 113 is to be arranged in a region between the magnetic path and the optical path in the objective lens 300.

Figure 4:
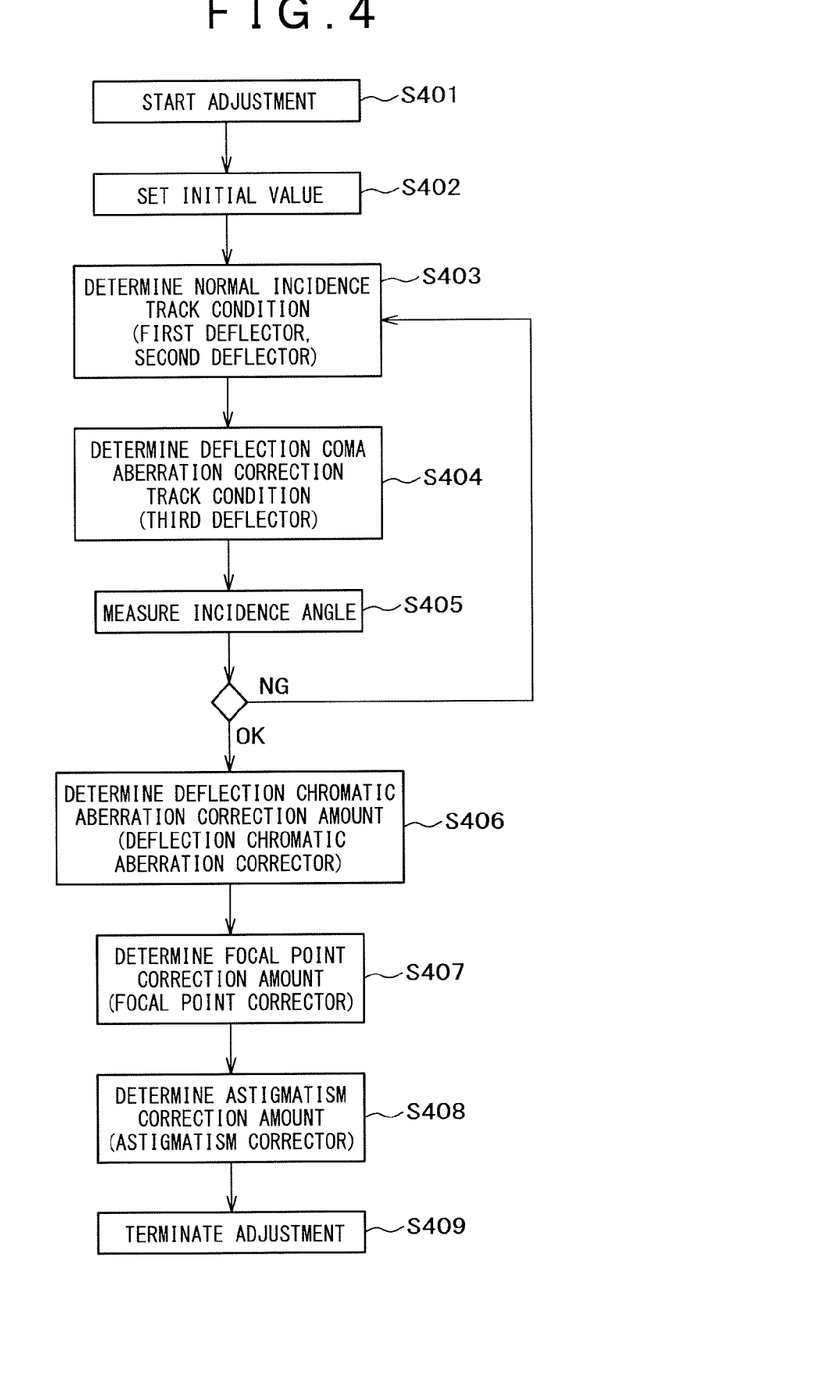
FIG. 4 is a flowchart illustrating an example of a procedure for adjusting the scanning electron microscope according to the first embodiment.

A method of adjusting the scanning electron microscope according to this embodiment is described below with reference to FIG. 4. Adjustment is started (S401) and initial values are set (S402). Firstly, initial values of the strength of each deflector in X and Y directions are set respectively. The initial value set here may be a parameter corresponding to an amount of current per amount of deflection on the sample. Next, a condition for the electron beam (primary electrons) 116 to vertically enter the sample 114 when deflected by the first and second deflectors 107, 109 is determined (S403). The deflection is performed on the sample using the previously set initial values to measure an incidence angle. If the incidence angle is larger than a specified value, the incidence angle is corrected by adjusting the parameters corresponding to the respective amounts of current per amount of deflection of the first deflector and the second deflector in X and Y directions. Then, a track under the condition of reducing the deflection coma aberration is determined using the third deflector 113 (S404). That is, the coma aberration at the time of deflection is determined, the parameters corresponding to the respective amounts of current per amount of deflection of the third deflector in X and Y directions are adjusted, and thereby correcting the deflection coma aberration. Next, the incidence angle of the electron beam 116 is measured (S405). If the track deviates from the normal incidence, the process returns to Step S403 to achieve the normal incidence using the first and second deflectors 107, 109. By repeating this loop (Step S403 to Step S405), the condition is found for limiting the values for satisfying both the normal incidence and the reduction of the deflection coma aberration. When using the device, the three deflectors can be cooperatively operated by applying current thereto simultaneously according to the respective parameters the three deflectors.

This is made possible by coordinating the three deflectors 113, 107, 109 including the deflector disposed in the magnetic path of the lens. This cannot be achieved by only two deflectors 107, 109 or by three deflectors in a region away from the objective lens 300.

Furthermore, the device according to this embodiment is provided with the deflection chromatic aberration corrector 120, the focal point corrector 118, and the astigmatism corrector 119 (see FIG. 1), and capable of correcting these three aberrations that may degrade the resolution other than the deflection coma aberration caused by deflection. In the flow chart shown in FIG. 4, to use these correctors, parameters (amount corresponding to drive current or drive voltage of the corrector per amount of deflection) for correcting a deflection chromatic aberration (S406), correcting a field curvature (S407), and for correcting an astigmatism aberration (S408) are determined, thereby terminating the entire adjustment (S409).

Figure 5:
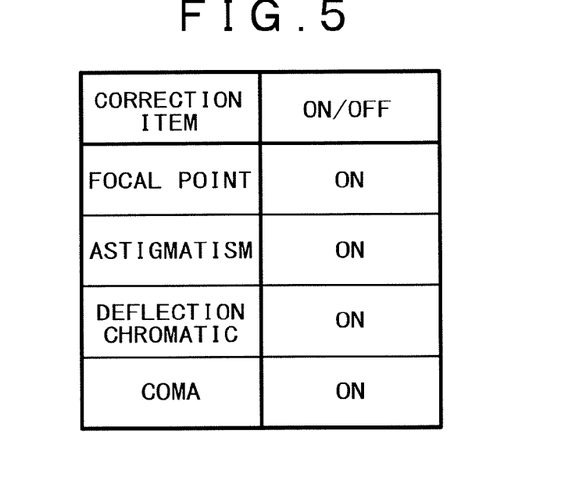
FIG. 5 is a chart showing an example of items displayed on a user interface screen of the scanning electron microscope according to the first embodiment.

Next, an example of items displayed on a user interface screen of the scanning electron microscope is described with reference to FIG. 5. FIG. 5 shows the user interface for using the device. Each correction item is selectable, and in this embodiment, the selection is made so as to correct all correctable aberrations including the focal point astigmatism, deflection chromatic, and deflection coma aberrations.

Figure 10:
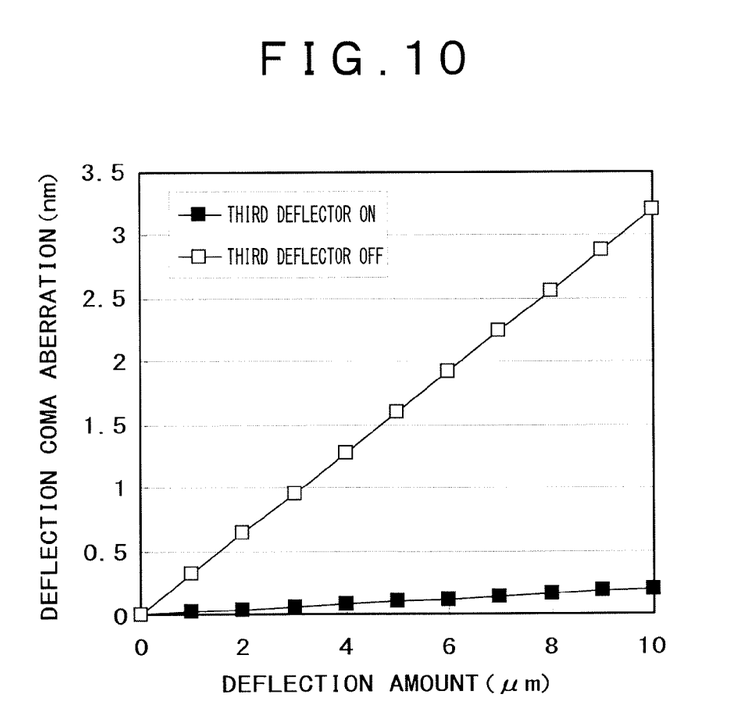
FIG. 10 is a comparison chart between the deflection coma aberration in the scanning electron microscope according to the first embodiment and that in the conventional device.

The deflection coma aberration is corrected using the scanning electron microscope described above. FIG. 10 shows size comparison between the deflection coma aberrations with and without actuation of the third deflector (in-lens deflector). Consequently, this achieves substantial elimination of the resolution degradation in a visual field with an angular deflection as large as 30 µm and the normal incidence by cooperatively operating the three deflectors and the three correctors. By using the device according to this embodiment, more precise observation images can be obtained and inspections and measurements can be performed with higher accuracy.

As described above, by providing the in-lens deflector, this embodiment can provide a charged particle beam apparatus capable of reducing the deflection coma aberration even when scanning a wide visual field. Moreover, by correcting the deflection chromatic aberration, the field curvature, and the astigmatism aberration as well, the substantial elimination of the resolution degradation can be achieved.

Second Embodiment

A second embodiment of the present invention is described below with reference to FIGS. 6 and 7. It should be noted that what is described in the first embodiment but not in the second embodiment is also applicable to this embodiment unless otherwise specified.

Figure 6:
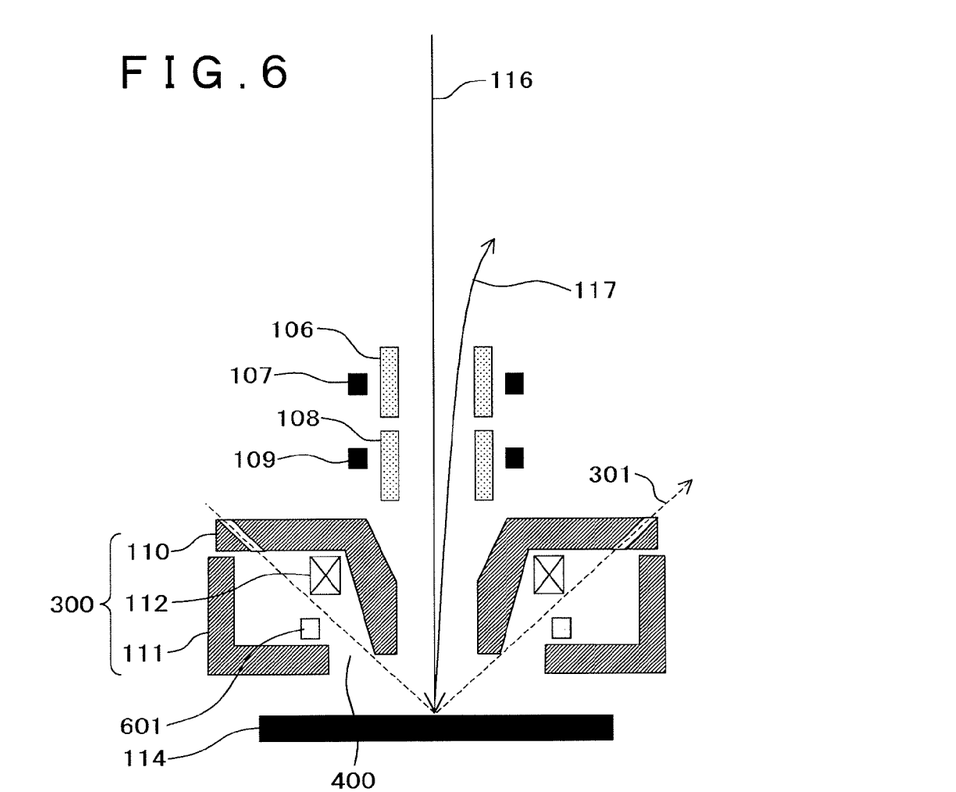
FIG. 6 is an enlarged cross sectional view of a main part illustrating an objective optical system in the scanning electron microscope (scanning electron microscope) according to a second embodiment of the present invention.

FIG. 6 is an enlarged cross sectional view of a main part illustrating an objective optical system in the scanning electron microscope according to this embodiment. The general schematic configuration of the device is similar to that shown in FIG. 1. In this embodiment, an octapole electrostatic deflector 601 in the magnetic path of the objective lens 300 as the third deflector (in-lens deflector). An advantage of the electrostatic deflector 601 is to avoid a response delay due to the eddy current.

Figure 7:
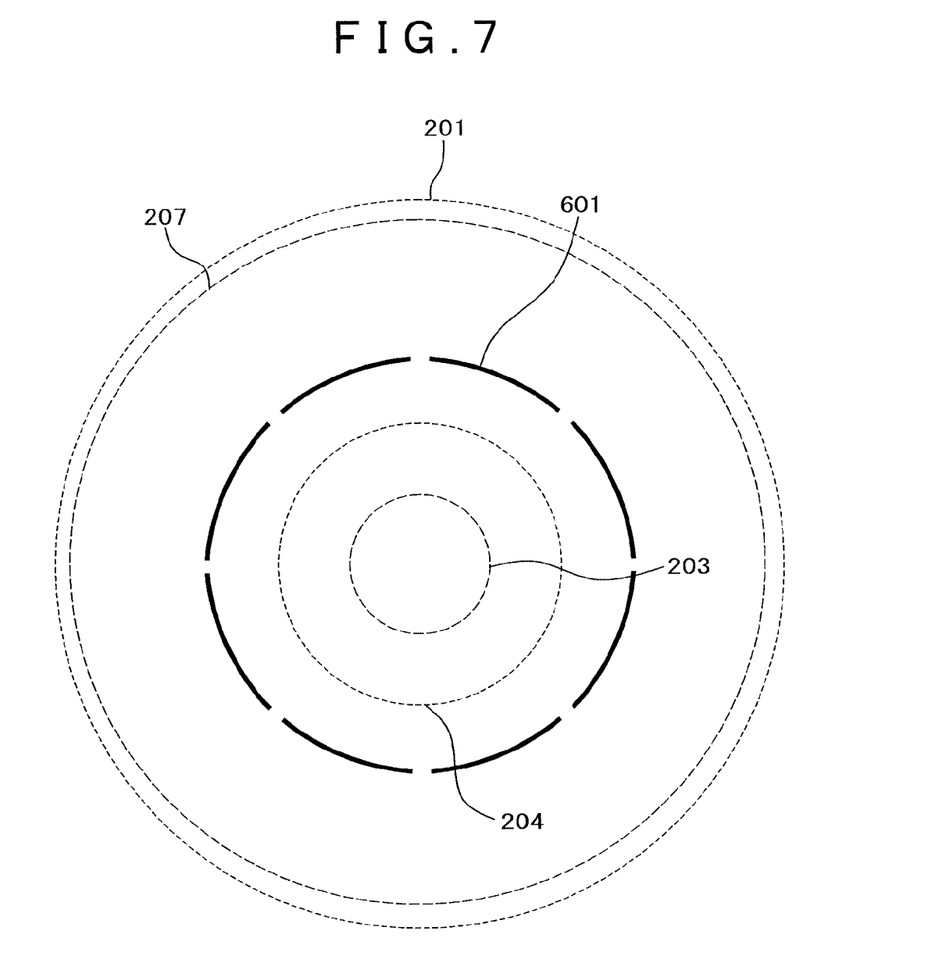
FIG. 7 is a top view of a third deflector in the scanning electron microscope according to the second embodiment.

FIG. 7 shows a top view of the third deflector in the scanning electron microscope according to this embodiment. A diameter of the electrostatic deflector 601 is made larger than diameters of the inner peripheries 203, 204 of the upper magnetic path and the lower magnetic path forming the lens magnetic field, and smaller than diameters of the outer peripheries 207, 201 of the upper magnetic path and the lower magnetic path. In the case of the electrostatic deflector 601, because the magnetic path of the lens is conductive permalloy, there is also an effect of shielding an electrostatic deflection field. This makes the deflection field overlap the lens magnetic field, as in the first embodiment. In this embodiment as well the upper magnetic path 110 is applied with positive voltage and the sample 114 is applied with negative voltage, which forms the electrostatic lens on the sample. Therefore, it is effective that an average voltage of the electrostatic deflector 601 should be adjusted so as not to affect the electrostatic lens, and it is adjusted to be no higher than the voltage in the upper magnetic path and no lower than the voltage in the lower magnetic path. It is set to a voltage close to that in the lower magnetic path 111 in this embodiment.

Consequently, this achieves the substantial elimination of the resolution degradation in a visual field with an angular deflection as large as 30 µm and the normal incidence by cooperatively operating the three deflectors including the two electromagnetic deflectors 107, 109 on the upper stage and the three correctors. By using the device according to this embodiment, more precise observation images can be obtained and inspections and measurements can be performed with higher accuracy.

As described above, this embodiment can provide a similar effect as the first embodiment. Moreover, by replacing the in-lens deflector with the electrostatic deflector, the ferrite shield can be eliminated to simplify the device configuration.

Third Embodiment

A third embodiment of the present invention is described below with reference to FIGS. 8 and 9. It should be noted that what is described in the first or second embodiment but not in the third embodiment is also applicable to this embodiment unless otherwise specified.

Figure 8:
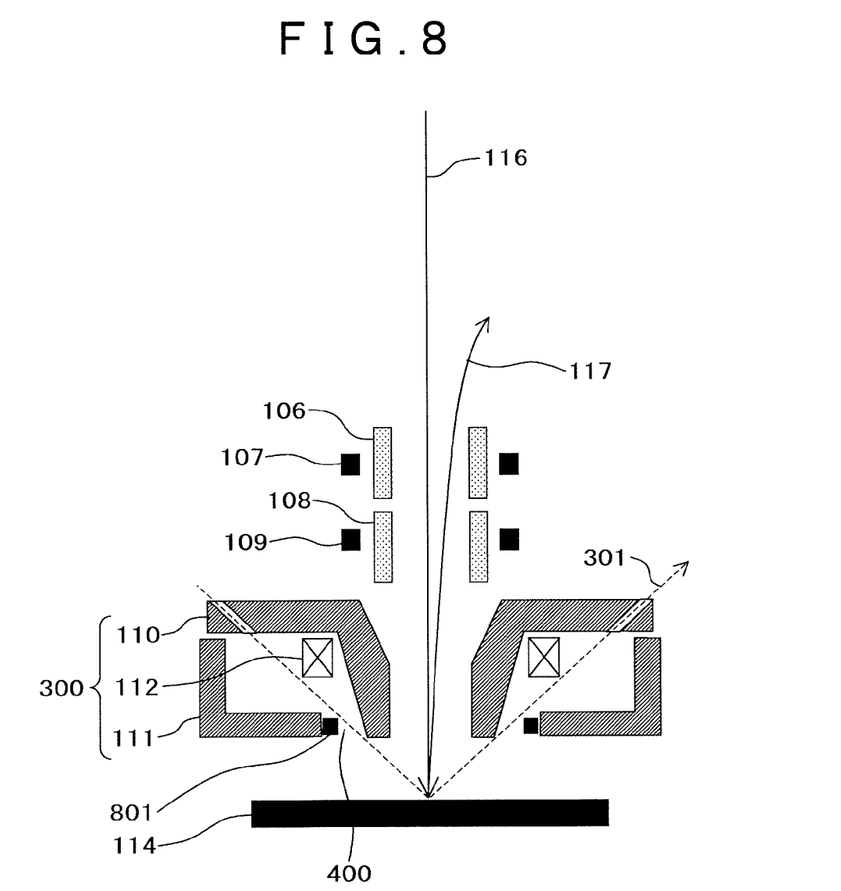
FIG. 8 is an enlarged cross sectional view of a main part illustrating an objective optical system in the scanning electron microscope (scanning electron microscope) according to a third embodiment of the present invention.
Figure 9:
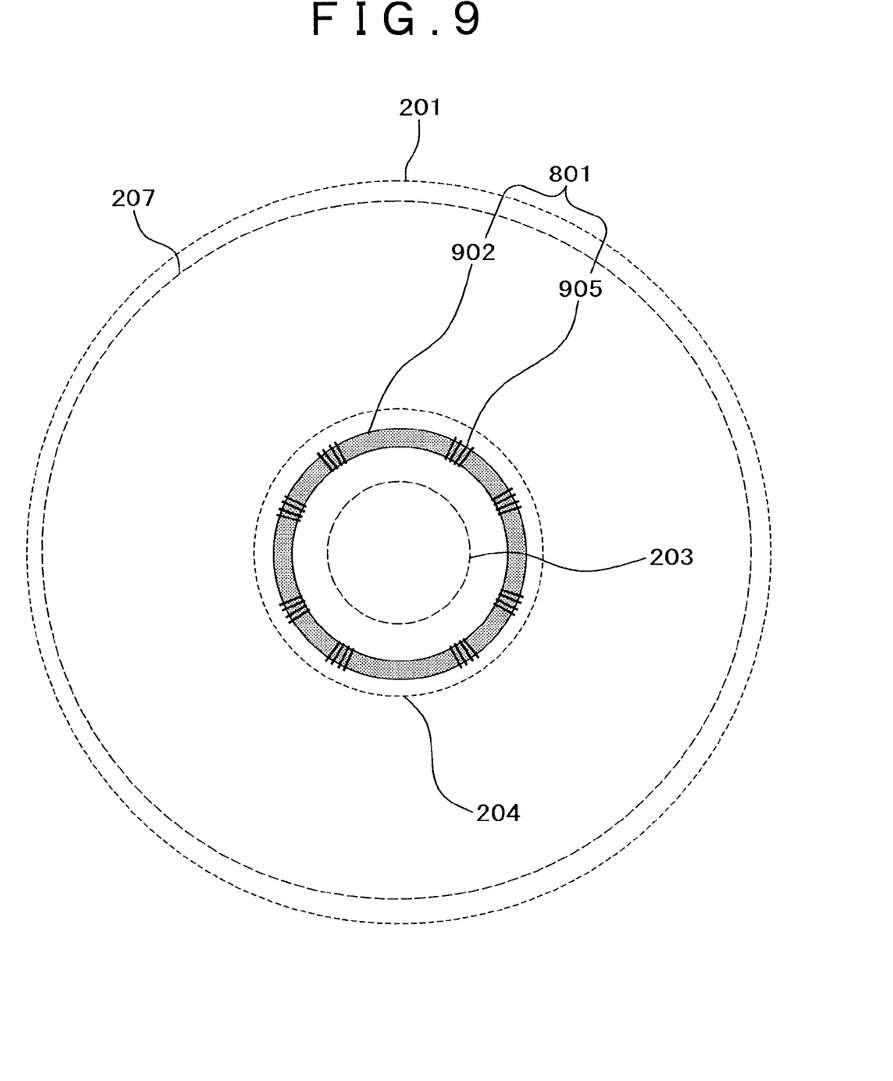
FIG. 9 is a top view of a third deflector in the scanning electron microscope according to the third embodiment.

FIG. 8 is an enlarged cross sectional view of a main part illustrating an objective optical system in the scanning electron microscope according to this embodiment. The general schematic configuration of the device is similar to that shown in FIG. 1. In this embodiment, a third deflector (in-lens deflector) 801, which is an electromagnetic deflector, is arranged outside the upper magnetic path 110 of the electromagnetic lens (objective lens). Denoted by 902 is a ferrite core of the third deflector, and 905 is a toroidal coil. In this embodiment, the in-lens deflector is also disposed closer to the objective lens coil than the aperture end facing the sample 114 for the objective lens 300. FIG. 9 is a top view of the third deflector. The third deflector 801 is a dense-core toroidal deflector, of which diameter is made larger than the diameter of the inner periphery of the upper magnetic path forming the lens magnetic field and smaller than the diameter of the inner periphery 204 of the lower magnetic path and the diameters of the outer peripheries 207, 201 of the upper magnetic path and the lower magnetic path. In this embodiment, because the diameter of the third deflector 801 is smaller than the inner periphery 294 of the lower magnetic path, the shielding effect of the lens magnetic path is lowered. However, in the region above the sample which is important for the primary electrons, it is possible to achieve a sufficient effect of overlapping the lens field and the deflection field even with the shielding effect by the upper magnetic path 110 alone. Moreover, though the magnetic body of the third deflector may affect the distribution formation of the lens magnetic field, the toroidal deflector would have a rotationally symmetrical magnetic body, which should not generate an asymmetrical field that reduces the on-axis resolution. As in the first embodiment, the reduction of the deflection coma aberration is made possible by coordinating with the two-stage deflectors 107, 109 on the upper stage in the objective lens, and the resolution degradation can be avoided in the visual field with an angular deflection as large as 30 µm by coordinating corrections of the focal point, astigmatism, and deflection chromatic aberrations as well. By using the device according to this embodiment, more precise observation images can be obtained and inspections and measurements can be performed with higher accuracy.

As described above, this embodiment can provide a similar effect as the first embodiment. Moreover, this embodiment can eliminate the ferrite shield.

Although the device using an electron beam has been described in the above embodiments, it is also possible to use an ion beam. In such a case, the electrostatic deflector is desirable as the third deflector. This can largely deflect even an ion beam. Moreover, the present invention is not limited to the embodiments described above but can include various modifications. For example, the above embodiments are described in detail for clearly explaining the invention, and are not necessarily limited to include all the configurations described. Moreover, it is also possible to replace a part of a configuration in one embodiment with a configuration in another embodiment, and also to add a configuration in one embodiment to a configuration in another embodiment. Furthermore, it is also possible to add another configuration to, eliminate, or replace a part of a configuration in each embodiment.

REFERENCE SIGNS LIST

101 Electron Gun
102 first aligner
103 first condenser lens
104 second aligner
105 second condenser lens
106 first scanning deflector
107 first deflector
108 second scanning deflector
109 second deflector
110 objective lens upper magnetic path
111 objective lens lower magnetic path
112 objective lens coil
113 third deflector
114 sample
115 stage
116 primary electron
117 secondary electron
118 focal point corrector
119 astigmatism corrector
120 deflection chromatic aberration corrector 121 detector
131 electron gun control unit
132 first aligner control unit
133 first condenser lens control unit
134 second aligner control unit
135 second condenser lens control unit
136 detection system control unit
137 first scanning deflector control unit
138 first deflector control unit
139 second scanning deflector control unit
140 second deflector control unit
141 booster voltage control unit
142 objective lens control unit
143 third deflector control unit
144 sample voltage control unit
145 recording device
146 control operation device for whole apparatus
147 display device
148 focal point corrector control unit
149 astigmatism corrector control unit
150 deflection chromatic aberration corrector control unit
201 outer periphery of objective lens lower magnetic path
202 ferrite core of third deflector
203 inner periphery of objective lens upper magnetic path
204 inner periphery of objective lens lower magnetic path
205 toroidal coil
207 outer periphery of objective lens upper magnetic path
300 objective lens
301 height-detection optical path
302 upper magnetic path ferrite shield
303 lower magnetic path ferrite shield
400 aperture of objective lens
601 third electrostatic deflector
801 third deflector
902 ferrite core of third deflector
905 toroidal coil

The invention claimed is:

1. A charged particle beam apparatus, comprising:
a charged particle source;
an upper stage deflector deflecting a charged particle beam emitted from the charged particle source;
an electromagnetic objective lens irradiating the charged particle beam deflected by the upper stage deflector onto a sample; and
a stage on which the sample is placed,
wherein the electromagnetic objective lens has an upper magnetic path and a lower magnetic path and an objective lens coil surrounded by the upper magnetic path and the lower magnetic path, an aperture constituted by the upper magnetic path and the lower magnetic path and positioned to face the sample, and an in-lens deflector arranged between the objective lens coil and an end of the aperture.

2. The charged particle beam apparatus according to claim 1, further comprising:
a means for providing a potential difference between some of the magnetic paths and the sample.

3. The charged particle beam apparatus according to claim 2, wherein the in-lens deflector is arranged outside the magnetic path that causes the potential difference with the sample.

4. The charged particle beam apparatus according to claim 1, wherein the in-lens deflector is controlled in conjunction with the upper stage deflector based on a predetermined relationship.

5. The charged particle beam apparatus according to claim 1, wherein the in-lens deflector is a dense-core toroidal electromagnetic deflector.

6. The charged particle beam apparatus according to claim 1, wherein a ferrite shield is arranged in at least a part between the upper magnetic path and the lower magnetic path and the in-lens deflector.

7. The charged particle beam apparatus according to claim 5, wherein a surface of a magnetic body used as a core of the dense-core toroidal electromagnetic deflector is flat without any irregular structure in its rotating direction.

8. The charged particle beam apparatus according to claim 1, wherein the in-lens deflector is arranged in a region between the upper magnetic path and the lower magnetic path and an optical path for measuring a height of the sample.

9. The charged particle beam apparatus according to claim 1, wherein the charged particle source is an ion source, and the in-lens deflector is an electrostatic deflector.

10. The charged particle beam apparatus according to claim 1, wherein the electromagnetic objective lens is of semi-in-lens type.

11. A charged particle beam apparatus comprising:
a charged particle source;
an upper stage deflector;
an electromagnetic objective lens; and
a stage on which a sample is placed, all sequentially arranged along a travelling direction of a charged particle beam emitted from the charged particle source,
wherein the electromagnetic objective lens has:
an upper magnetic path and a lower magnetic path;
an objective lens coil surrounded by the upper magnetic path and the lower magnetic path;
an aperture constituted by the upper magnetic path and the lower magnetic path and arranged to face the sample, and
an in-lens deflector including a toroidal coil and arranged between the objective lens coil and an end of the aperture.

* * * * *